(12) United States Patent
Nagano et al.

(10) Patent No.: US 7,015,564 B2
(45) Date of Patent: Mar. 21, 2006

(54) CAPACITIVE ELEMENT AND SEMICONDUCTOR MEMORY DEVICE

(75) Inventors: Yoshihisa Nagano, Osaka (JP); Shinichiro Hayashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/916,482

(22) Filed: Aug. 12, 2004

(65) Prior Publication Data

US 2005/0006684 A1 Jan. 13, 2005

(30) Foreign Application Priority Data

Sep. 2, 2003 (JP) .............................. 2003-309481

(51) Int. Cl.
*H01L 29/00* (2006.01)
(52) U.S. Cl. ....................................... 257/532; 257/295
(58) Field of Classification Search ................ 257/295, 257/532, 516, 758
See application file for complete search history.

(56) References Cited

U.S. PATENT DOCUMENTS

| | | | | |
|---|---|---|---|---|
| 5,790,366 A * | 8/1998 | Desu et al. | .................. | 361/305 |
| 5,852,307 A * | 12/1998 | Aoyama et al. | ............. | 257/295 |
| 6,180,974 B1 * | 1/2001 | Okutoh et al. | .............. | 257/306 |
| 6,339,008 B1 * | 1/2002 | Takenaka | ..................... | 438/396 |
| 6,521,927 B1 * | 2/2003 | Hidaka et al. | .............. | 257/295 |
| 6,815,223 B1 * | 11/2004 | Celinska et al. | ............... | 438/3 |
| 6,880,920 B1 * | 4/2005 | Murai | ......................... | 347/70 |
| 2004/0130026 A1 * | 7/2004 | Imai et al. | ................... | 257/751 |
| 2004/0248360 A1 * | 12/2004 | Ohashi et al. | .............. | 438/240 |
| 2005/0136555 A1 * | 6/2005 | Wang | ............................ | 438/3 |

FOREIGN PATENT DOCUMENTS

JP     2001-53250 A     2/2001

* cited by examiner

*Primary Examiner*—S. V. Clark
(74) *Attorney, Agent, or Firm*—McDermott Will & Emery LLP

(57) ABSTRACT

A capacitive element includes a lower electrode having a three-dimensional shape, an upper electrode formed so as to be opposed to the lower electrode, and a capacitor insulating film formed between the lower and upper electrodes and made of a crystallized ferroelectric material. The thickness of the capacitor insulating film is set at 12.5 through 100 nm both inclusive.

16 Claims, 7 Drawing Sheets

CAPACITIVE ELEMENT AND SEMICONDUCTOR MEMORY DEVICE

CROSS-REFERENCE TO RELATED APPLICATIONS

The disclosure of Japanese Patent Application No. 2003-309481 filed Sep. 2, 2003 including specification, drawing and claims is incorporated herein by reference in its entirely.

BACKGROUND OF THE INVENTION (1) Field of the Invention

The present invention relates to a capacitive element having a three-dimensional structure using a ferroelectric material as a capacitor insulating film and a semiconductor memory device using the same.

(2) Description of Related Art

In recent years, ferroelectric films with spontaneous polarization characteristics have been actively researched and developed for the sake of putting into practical use Nonvolatile Random Access Memories (RAM) capable of lower-voltage and higher-speed writing and reading operations than known ones. In particular, in order to realize megabit-class semiconductor memory devices mounted on Large-Scale Integrated Circuits (LSI) composed of Complementary Metal-Oxide Semiconductor (CMOS) transistors each having a design rule of 0.18 $\mu$m or less, capacitive elements need be developed which each have a three-dimensional structure to realize a large capacitance in spite of a small area. Such capacitive elements each having a three-dimensional structure usually require the formation of ferroelectric films serving as capacitor insulating films on lower electrodes formed to have uneven surfaces.

In order to achieve higher integration, while capacitive elements need be formed three-dimensionally to reduce their sizes in lateral directions, ferroelectric films need become as thin as possible to secure the capacitances of the capacitive elements. Accordingly, excellent polarization characteristics must be achieved for thin ferroelectric films.

Capacitive elements of a known example will be described hereinafter with reference to FIGS. 6 and 7 (see, for example, Japanese Laid-Open Patent Publication No. 2001-53250).

FIG. 6 shows a cross-sectional structure of an essential part of a known semiconductor memory device (DRAM) having capacitive elements of three-dimensional structures. As shown in FIG. 6, a first silicon oxide film 102 is formed on a semiconductor substrate 101 formed with semiconductor elements and interconnects (not shown) and is formed with n-type impurity-doped plugs 103 of low-resistance polysilicon. A silicon nitride film 104 and a second silicon oxide film 105 are successively deposited on the first silicon oxide film 102 and formed with deep holes 106 to expose the corresponding plugs 103.

Each deep hole 106 has a diameter of approximately 0.3 $\mu$m, a depth of approximately 1.3 $\mu$m and an aspect ratio of 4 or more. Lower electrodes 107 of polysilicon are formed on the bottom surfaces and inner walls of the corresponding deep holes 106 to roughen their surfaces. A capacitor insulating film 108, which is a layered film of a silicon nitride film and a tantalum pentoxide ($Ta_2O_5$) in bottom-to-top order, is deposited to cover the surfaces of the lower electrodes 107. An upper electrode 109 of titanium nitride (TiN) is deposited and formed on the capacitor insulating film 108. A capacitive element for storing information is composed of each lower electrode 107, the capacitor insulating film 108 and the upper electrode 109.

The above publication discloses that, as shown in FIG. 7, a tantalum pentoxide ($Ta_2O_5$) film of a high-dielectric-constant material used for the capacitor insulating film 108 is desirably set to have a thickness of 4 through 7 nm to satisfy the following two restrictions: the leakage current should become minimum; and the effective thickness of the tantalum pentoxide film should become minimum in terms of the thickness of a silicon dioxide ($SiO_2$) film.

SUMMARY OF THE INVENTION

However, the structure of the known capacitive element using a high-dielectric-constant material for a capacitor insulating film cannot provide excellent characteristics, and therefore cannot provide a high-performance nonvolatile memory device.

The reason for this will be described below in detail.

When a high-dielectric-constant material such as tantalum oxide is used for a capacitor insulating film as in the known example, only the following two points are important in thinning the film: the leakage current passing through the capacitor insulating film should become minimum; and the effective thickness of the capacitor insulating film should become minimum in terms of the thickness of a silicon oxide film.

On the other hand, when a ferroelectric material is used for a capacitor insulating film, the most important challenge in thinning the film is to realize excellent polarization characteristics, because the spontaneous polarization characteristics of the ferroelectric material are utilized to store data. The present inventors have conducted various studies to cope with this challenge and obtained the finding that when a ferroelectric film is reduced in thickness beyond a certain value, it rapidly degrades the polarization characteristics. In addition, the inventors also obtained the finding that when the ferroelectric film is reduced in crystal grain size beyond a certain value, it also rapidly degrades the polarization characteristics. These findings will be described below in detail.

The polarization of a ferroelectric film results from the displacement of ions in a crystal. Thus, in order to realize excellent polarization characteristics, most of the ferroelectric film must be composed of crystals. However, the interface region between the ferroelectric film and an electrode is composed of imperfect crystals or is close to amorphous. As a result, when the thickness of the ferroelectric film is reduced thinly enough to provide a noticeable influence of the interface region, excellent polarization characteristics cannot be realized. With the decreasing crystal grain size of the ferroelectric film, the displacement amount of ions in a crystal is reduced, the crystal region in the ferroelectric film is reduced, and conversely the grain-boundary region increases. Therefore, in this case, excellent polarization characteristics cannot be obtained.

As described above, the known semiconductor memory device having a capacitive element cannot provide excellent physical characteristics under the use of a ferroelectric material for a capacitor insulating film, and therefore cannot provide a high-performance nonvolatile memory device.

The present invention is made to solve the above conventional problem, and its object is to provide a capacitive element of a three-dimensional shape comprising a lower electrode and a capacitor insulating film made of a ferroelectric material and a semiconductor memory device using the same to prevent, by a simple method, the polarization characteristics of the ferroelectric material from being degraded and thus avoid adversely affecting data storage characteristics of the capacitive element.

In order to attain the above object, a capacitive element of the present invention comprises: a lower electrode having a three-dimensional shape; an upper electrode formed so as to be opposed to the lower electrode; and a capacitor insulating film formed between the lower and upper electrodes and made of a crystallized ferroelectric material, and the thickness of the capacitor insulating film is set within the range of 12.5 through 100 nm both inclusive.

As will be described later, the capacitive element of the present invention can prevent a ferroelectric material constituting the capacitor insulating film of a three-dimensional shape from being degraded in its polarization characteristics. As a result, a large-capacity nonvolatile semiconductor memory device with excellent data storage characteristics can be realized in spite of having a small circuit area. Therefore, the capacitive element can be finer, resulting in higher integration.

In the capacitive element of the present invention, it is preferable that the ferroelectric material has a polycrystalline structure and its crystal grain size is 12.5 through 200 nm both inclusive.

Thus, in spite of the use of a polycrystalline ferroelectric material, the ferroelectric material can certainly be prevented from being degraded in its polarization characteristics.

In the capacitive element of the present invention, the voltage applied to the capacitor insulating film is preferably 0.3 through 2.5 V both inclusive. Furthermore, the electric field applied to the capacitor insulating film is preferably 250 kV/cm$^2$ or more.

Thus, a sufficiently large value can be set as the ratio between the amount of charge in accordance with which data to be held in the capacitive element is determined as "1" and the amount of charge in accordance with which data are determined as "0". Therefore, excellent data storage characteristics can be realized.

In the capacitive element of the present invention, the capacitor insulating film is preferably composed of one material selected from $SrBi_2(Ta_xNb_{1-x})_2O_9$, $Pb(Zr_xTi_{1-x})O_3$ and $(Bi_xLa_{1-x})_4Ti_3O_{12}$ (where $0 \leq x \leq 1$). Thus, a ferroelectric film with excellent polarization characteristics can be achieved.

In the capacitive element of the present invention, it is preferable that the lower electrode has a convex cross section and the ratio of the height to width (height/width) of the lower electrode is 1 or more.

In this case, the width of the lower electrode is preferably 0.2 through 1.0 $\mu$m both inclusive.

Thus, the surface area of the capacitor insulating film can be increased. Therefore, the capacitive element can store a large amount of charge, enough to hold data and realize excellent polarization characteristics.

In the capacitive element of the present invention, it is preferable that the lower electrode is formed along the bottom and side surfaces of a hole in an interlayer insulating film and the ratio of the depth to diameter of the hole (depth/width) is 1 or more.

In this case, the diameter of the hole is preferably 0.2 $\mu$m through 0.8 $\mu$m both inclusive.

Thus, the surface area of the capacitor insulating film can be increased. Therefore, the capacitive element can store a large amount of charge, enough to hold data and realize excellent polarization characteristics.

A semiconductor memory device of the present invention comprises: a capacitive element; a transistor having source and drain regions formed in a semiconductor substrate; an interlayer insulating film formed on the semiconductor substrate to cover the transistor; and a plug contact formed in the interlayer insulating film to allow electrical connection with the source or drain region of the transistor, wherein the lower electrode of the capacitive element is formed to allow electrical connection with the plug contact.

Since the semiconductor memory device of the present invention comprises the capacitive element of the present invention, a semiconductor memory device with excellent data storage characteristics can be realized which can be formed on an LSI composed of CMOS transistors each having a design rule of 0.18 $\mu$m or less.

DETAILED DESCRIPTION OF THE INVENTION (Embodiment 1)

A first embodiment of the present invention will be described hereinafter with reference to the drawings.

Figure 1:
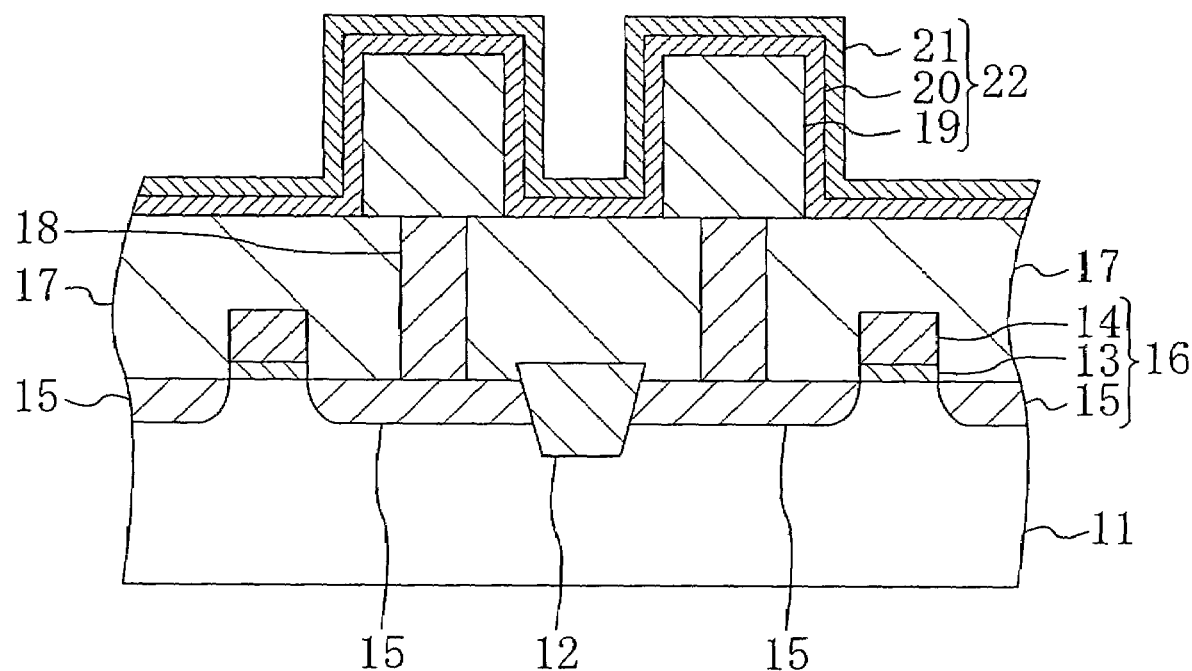
FIG. 1 is a structural cross-sectional view illustrating an essential part of a capacitive element of a three-dimensional structure according to a first embodiment of the present invention.

FIG. 1 illustrates the cross-sectional structure of an essential part of a capacitive element of a three-dimensional structure according to a first embodiment of the present invention.

As shown in FIG. 1, the principal surface of a semiconductor substrate 11 of silicon (Si) is partitioned into a plurality of element active regions by isolation films 12 each composed of a shallow trench isolation (STI). Gate insulating films 13 are selectively formed on the element active regions, and gate electrodes 14 are formed on the gate insulating films 13. Parts of each element active region located to both sides of the gate electrode 14 are formed with source/drain regions 15. The gate insulating film 13, gate electrode 14 and source/drain regions 15 constitute a memory cell transistor 16.

An interlayer insulating film 17 of silicon dioxide ($SiO_2$) or silicon nitride (SiN) is formed on the principal surface of the semiconductor substrate 11 to cover the memory cell transistors 16. It is formed with a plurality of plugs 18 made of tungsten (W) or n-type impurity-doped polysilicon with a low resistance to allow electrical connection between the plugs 18 and the source or drain regions 15 of the corresponding memory cell transistors 16.

A plurality of lower electrodes 19 are selectively formed on the interlayer insulating film 17 to allow electrical connection with the corresponding plugs 18. Although not shown, each lower electrode 19 has a layered structure of lower and upper layers. The lower layer is an oxygen barrier made of a single-layer film or multilayer film containing at least one of iridium (Ir), iridium dioxide ($IrO_2$), ruthenium (Ru), ruthenium dioxide ($RuO_2$), titanium aluminum nitride (TiAlN), tantalum aluminum nitride (TaAlN), and titanium silicon nitride (TiSiN). The upper layer is an electrode film made of platinum (Pt), iridium (Ir), iridium dioxide ($IrO_2$), ruthenium (Ru), ruthenium dioxide ($RuO_2$), or strontium ruthenium trioxide ($SrRuO_3$). The lower electrode 19 has a generally circular plan shape and a width (diameter) of 0.2 through 1.0 $\mu$m both inclusive. Furthermore, the height of the lower electrode 19 is in the range of 0.2 through 1.0 $\mu$m both inclusive within which the ratio of the height to width (height/width) of the lower electrode 19, i.e., the aspect ratio, is 1 or more.

The upper and side surfaces of the lower electrodes 19 are covered with a capacitor insulating film 20 of strontium bismuth tantalum niobate ($SrBi_2(Ta_xNb_{1-x})_2O_9$) that is a ferroelectric material (where $0 \leq x \leq 1$ and the same applies hereinafter). The capacitor insulating film 20 can be formed, for example, by metal organic chemical vapor deposition (MOCVD), atomic layer deposition or sputtering each having excellent step coverage.

The first embodiment is characterized by adjusting the deposition period during film formation to set the thickness of the capacitor insulating film 20 at 12.5 through 100 nm both inclusive. In this case, after the formation of the capacitor insulating film 20, heat treatment is performed thereon, for example, within the range from 500° C. to 700° C., to determine the density of crystal nuclei, and then the crystals of the capacitor insulating film 20 are grown, for example, at 800° C. In this way, the size of each of crystal grains of the ferroelectric material is set within the range from 12.5 nm to 200 nm. In this specification, the size of each crystal grain represents the largest diameter (large diameter) of the crystal grain in an arbitrary section of the capacitor insulating film 20 unless otherwise restricted.

The size of each crystal grain is determined in accordance with the density of crystal nuclei, and can be set within the range from 12.5 mm to 200 nm in an arbitrary section of the capacitor insulating film 20 by performing heat treatment on the capacitor insulating film 20 at 500° C. through 700° C. which is the range of the heat treatment for determining the density of crystal nuclei. The reason for this will be described below in detail. The capacitor insulating film 20 may have a smaller crystal grain size than 12.5 mm. There is no problem unless this affects physical characteristics (polarization characteristics) of the ferroelectric material.

An upper electrode 21 consisting of platinum (Pt), iridium (Ir), iridium dioxide ($IrO_2$), ruthenium (Ru), ruthenium dioxide ($RuO_2$), strontium ruthenium trioxide ($SrRuO_3$), or the like is formed on the capacitor insulating film 20. A capacitive element 22 for storing information is composed of the lower electrode 19, the capacitor insulating film 20 and the upper electrode 21.

As described above, in the first embodiment, the capacitor insulating film 20 made of a ferroelectric material constitutes a capacitive element 22 of a three-dimensional structure and is set to have a thickness of 12.5 through 100 mm both inclusive and a crystal grain size of 12.5 through 200 mm both inclusive. Therefore, the capacitor insulating film 20 made of a ferroelectric material can be prevented from being degraded in its polarization characteristics.

The reason why the thickness of the capacitor insulating film 20 made of a ferroelectric material is set within the above-described range will be described below with reference to FIGS. 2 and 3.

Figure 2:
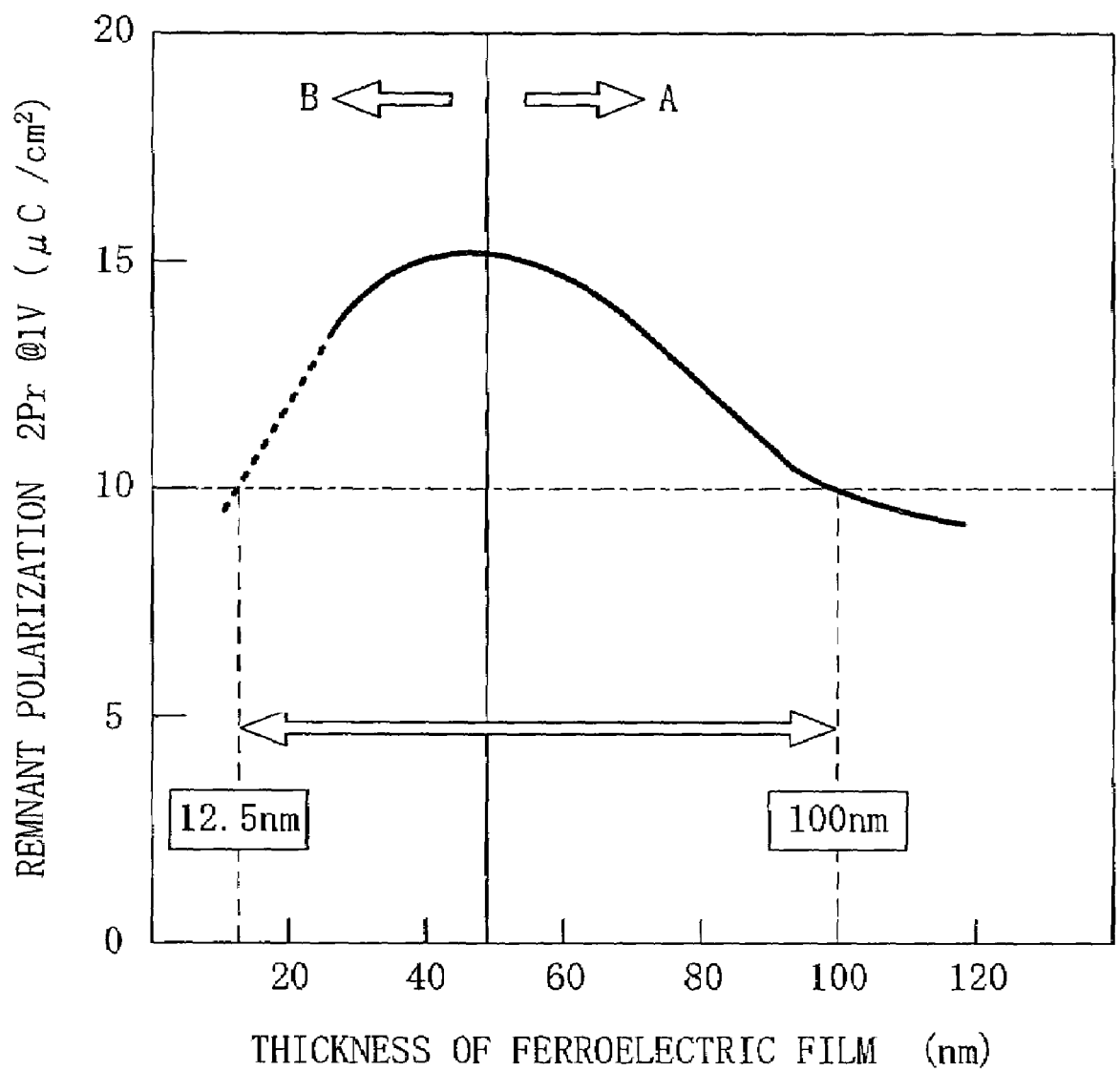
FIG. 2 is a graph illustrating the dependence of the remnant polarization of the capacitive element on the thickness of a ferroelectric film according to the first embodiment of the present invention.

FIG. 2 illustrates the results obtained by evaluating remnant polarization (2Pr) measured at the lowest imaginable voltage under the use of the capacitive element 22 of the first embodiment, i.e., 1.0 V, while varying the thickness of the capacitor insulating film of $SrBi_2(Ta_xNb_{1-x})_2O_9$ that is a ferroelectric material. The capacitive element used for this measurement is formed on a flat underlying layer. Platinum (Pt) is employed for the upper and lower electrodes. The average of the respective sizes of crystal grains in the ferroelectric material is 100 nm.

As shown in FIG. 2, in the zone in which the thickness of a ferroelectric material $SrBi_2(Ta_xNb_{1-x})_2O_9$ is 50 nm or more (A in FIG. 2), when the applied voltage is constant, the applied electric field becomes larger with reduction in the thickness of the ferroelectric material. Thus, the remnant polarization increases. On the other hand, the present inventors have found that in the zone in which the thickness of the ferroelectric material $SrBi_2(Ta_xNb_{1-x})_2O_9$ is 50 nm or less (B in FIG. 2), the significant influence of the interface region between the ferroelectric material and an electrode, which is composed of imperfect crystals or is close to amorphous, reduces the polarization characteristics of the ferroelectric material. More particularly, the remnant polarization decreases with reduction in the thickness of the ferroelectric material. When the thickness of the ferroelectric material is reduced beyond a certain thickness, this disenables the normal operation of a semiconductor memory device. Therefore, the certain thickness is the lower limit of the ferroelectric film thickness. The broken line of the graph in FIG. 2 represents that data have been extrapolated.

Figure 3:
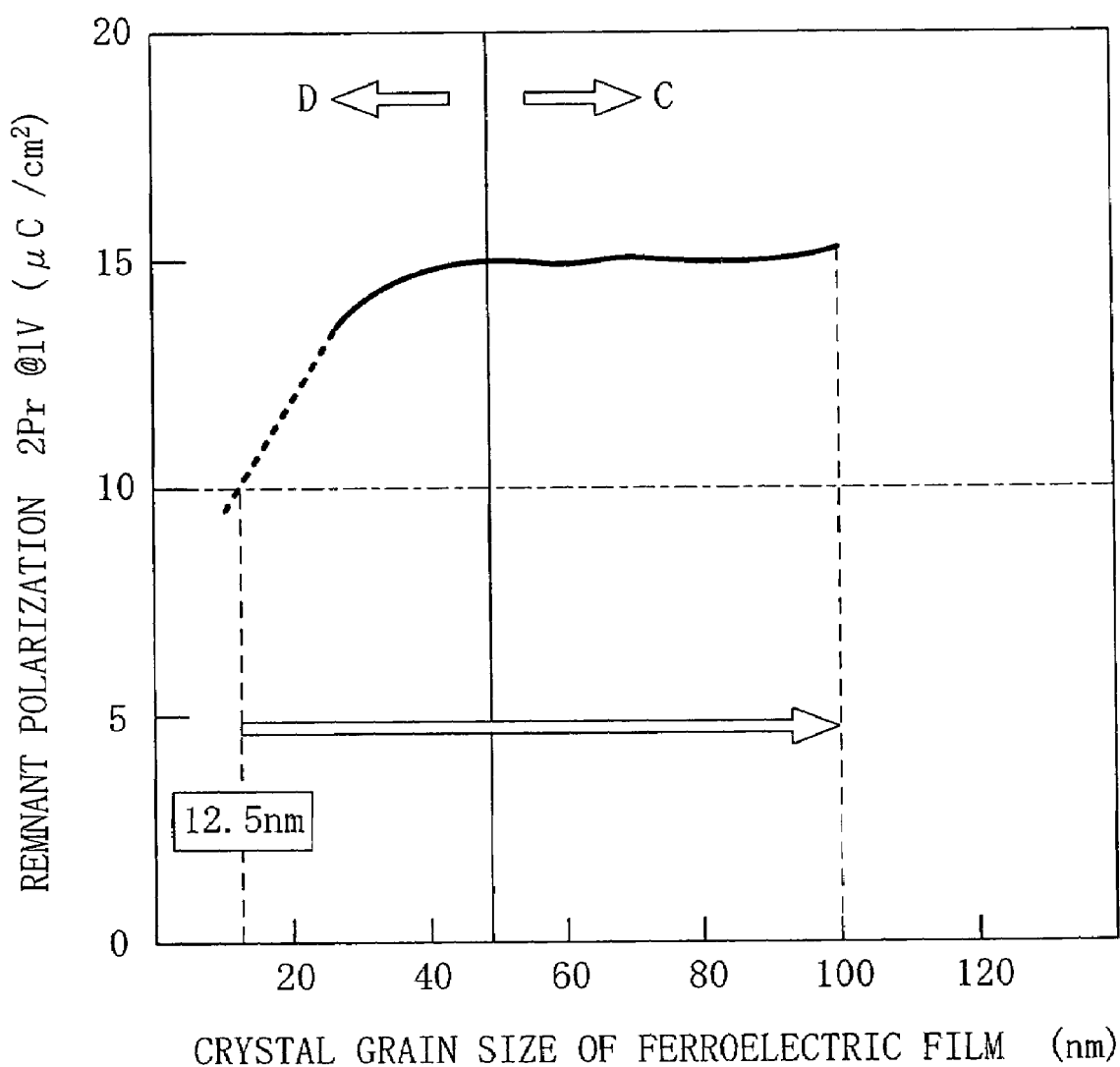
FIG. 3 is a graph illustrating the dependence of the remnant polarization of the capacitive element on the crystal grain size of the ferroelectric material.

FIG. 3 illustrates the results obtained by evaluating the remnant polarization (2Pr) of the ferroelectric material $SrBi_2(Ta_xNb_{1-x})_2O_9$ while varying the size of each crystal grain. As in FIG. 2, the remnant polarization (2Pr) is measured at 1.0 V, the capacitive element used for this measurement is formed on a flat underlying layer, and platinum (Pt) is employed for the upper and lower electrodes. The thickness of a ferroelectric film is 50 nm. The broken line of the graph in FIG. 3 represents that data have been extrapolated.

As shown in FIG. 3, in the zone in which the average of sizes of a plurality of crystal grains of the ferroelectric material $SrBi_2(Ta_xNb_{1-x})_2O_9$ is 50 nm or more (C in FIG. 3), the size of crystal grains in the ferroelectric film thickness direction is restricted by the film thickness and thereby becomes a constant value of 50 nm. Therefore, the remnant polarization hardly varies. On the other hand, the present inventors have found that in the zone in which the average of sizes of crystal grains is 50 nm or less (D in FIG. 3), a plurality of crystal grains are present in the ferroelectric film thickness direction, and the capacitive element is therefore affected by crystal grain boundary regions in the direction of application of an electric field to the capacitive element to decrease the polarization characteristics. Furthermore, with reduction in the size of each crystal grain of the ferroelectric material, the displacement amount of ions in a crystal is reduced and thus the remnant polarization decreases. When the size of the crystal grain of the ferroelectric material is reduced beyond a certain value, this disenables the normal operation of a semiconductor memory device. Therefore, the certain size of the crystal grain is the lower limit of the crystal grain size of the ferroelectric film.

The present inventors have found that when the remnant polarization of the ferroelectric film is 10 $\mu C/cm^2$ or less, this causes a misoperation of the semiconductor memory device.

As seen from the results shown in FIG. 2, the lower thickness limit of the ferroelectric film is 12.5 nm and the upper thickness limit of the film is 100 nm. Furthermore, as seen from the results shown in FIG. 3, the lower crystal grain size limit of the ferroelectric film is 12.5 nm. The upper crystal grain size limit of the ferroelectric film is determined in accordance with the conditions of heat treatment on the ferroelectric material that will be the capacitor insulating film of this embodiment, and in this case the upper limit value is 200 nm.

When the thickness of the capacitor insulating film of a ferroelectric material is set within the above-mentioned range, the voltage applied to the capacitor insulating film preferably falls within the range from 0.3 V to 2.5 V. The electric field applied to the capacitor insulating film is preferably 250 kV/cm or more. The reason for this will be described with reference to FIG. 4.

Figure 4:
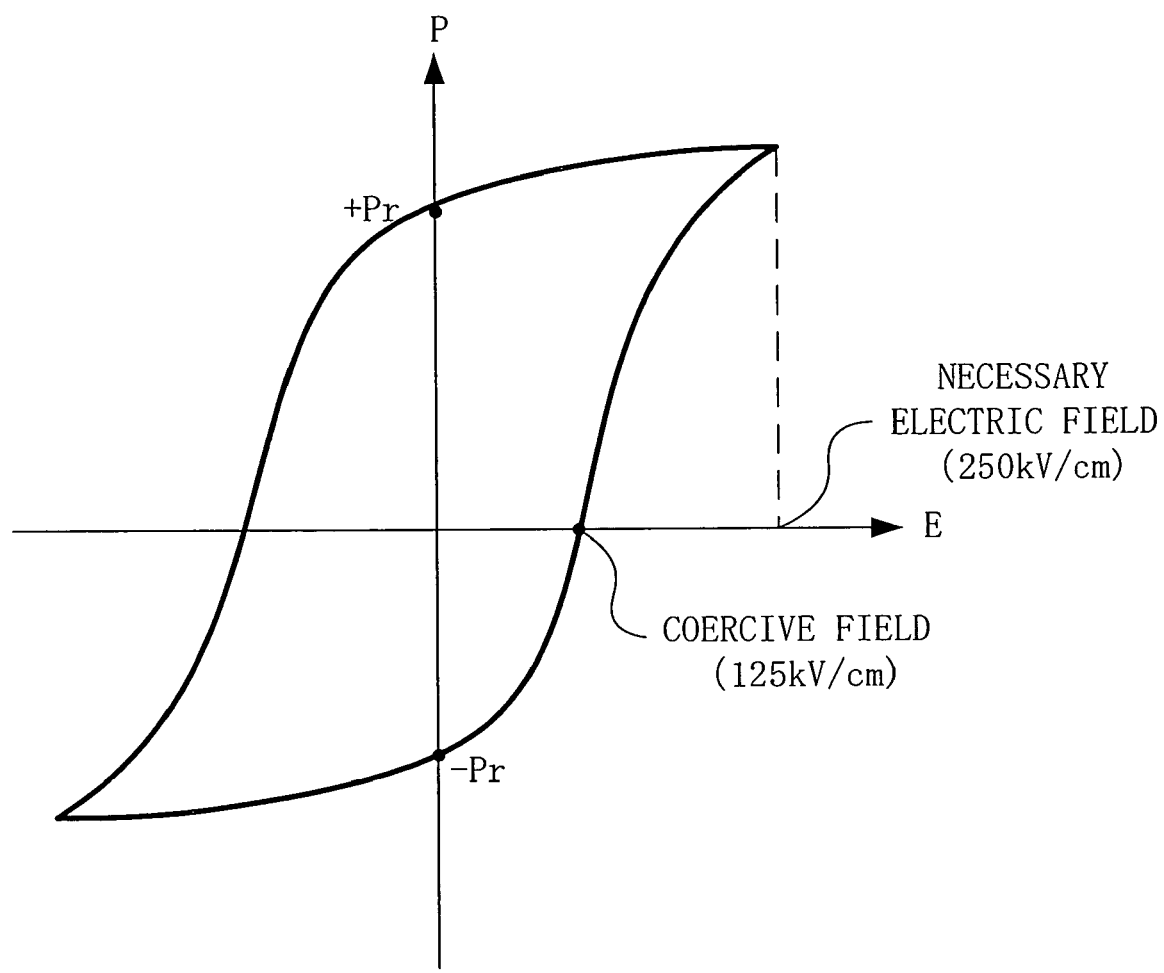
FIG. 4 is a graph illustrating the dependence of the polarization of the capacitive element on an applied electric field according to the first embodiment of the present invention.

FIG. 4 illustrates polarization-electric field characteristics (hysteresis loop) of the capacitive element using the ferroelectric material $SrBi_2(Ta_xNb_{1-x})_2O_9$ as a capacitor insulating film. In the case of the capacitive element using the ferroelectric material for the capacitor insulating film, when the difference between the amount of charge corresponding to held data "1" and the amount of charge corresponding to held data "0" is increased as much as possible, this means that the operating margin of the semiconductor memory device is extended. This represents that the remnant polarization at an electric field (E) of 0 in FIG. 4, i.e., the difference between +Pr and −Pr in FIG. 4, is increased. To cope with this, the electric field applied to the capacitive element need be increased as much as possible. The present inventors' various experiments have shown that the lower limit of this applied electric field is twice or more as large as the electric field having a polarization of 0, i.e., a coercive field. To be specific, since as shown in FIG. 4 the value of the coercive field is 125 kV/cm, the lower limit of the applied electric field is 250 kV/cm. When the value of this electric field is converted to the thickness of the capacitor insulating film, the applied voltage is as follows.

When the thickness of the capacitor insulating film is 12.5 nm, 250 kV/cm×12.5 nm=0.31 V. When the thickness of the capacitor insulating film is 100 nm, 250 kV/cm×100 nm=2.5 V. Therefore, if the applied voltage is set within the range from 0.3 V to 2.5 V, excellent data storage characteristics can be achieved within the above range of the thickness of the capacitor insulating film.

Plumbum zirconium titanate ($Pb(Zr_xTi_{1-x})O_3$) or bismuth lanthanum titanate (($Bi_xLa_{1-x})_4Ti_3O_{12}$) (where $0 \leq x \leq 1$), instead of $SrBi_2(Ta_xNb_{1-x})_2O_9$, can be used as the ferroelectric material constituting the capacitor insulating film 20.

(Embodiment 2)

A second embodiment of the present invention will be described hereinafter with reference to the drawing.

Figure 5:
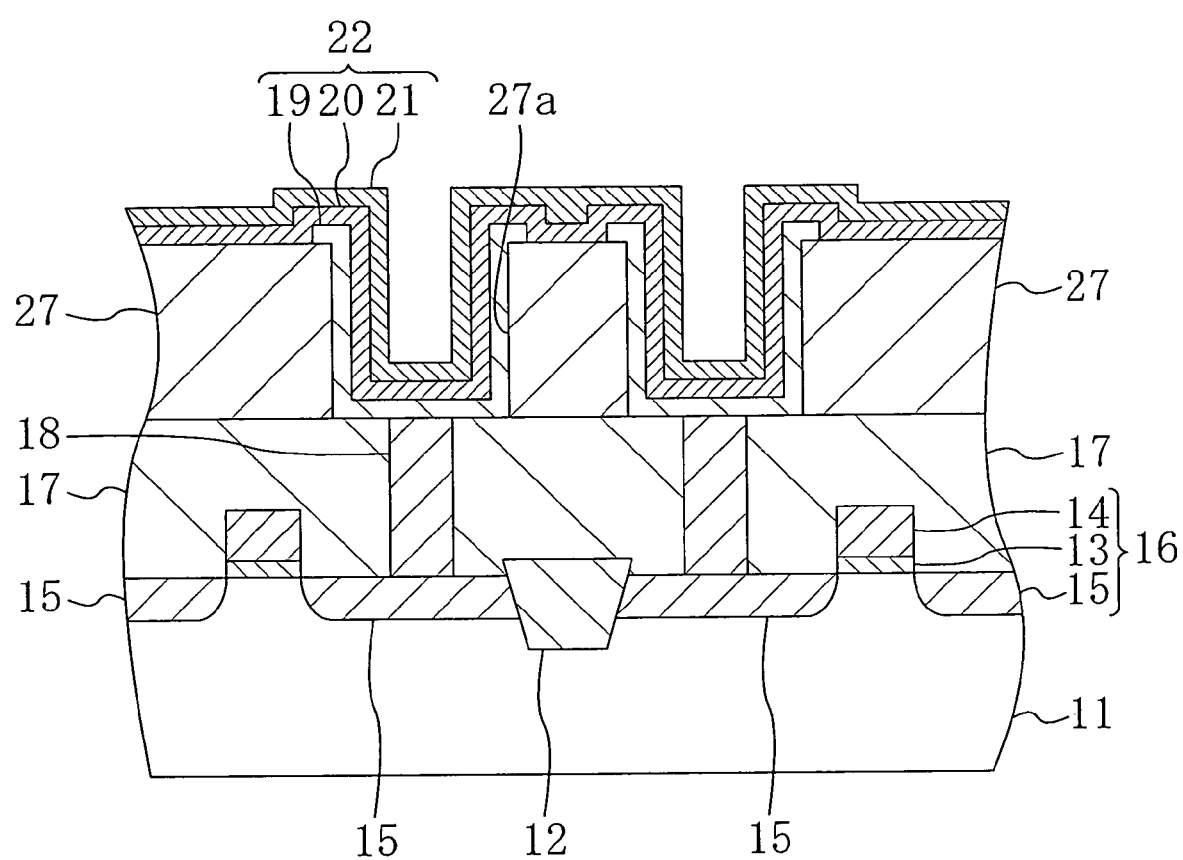
FIG. 5 is a structural cross-sectional view illustrating an essential part of a capacitive element of a three-dimensional structure according to a second embodiment of the present invention.
Figure 6:
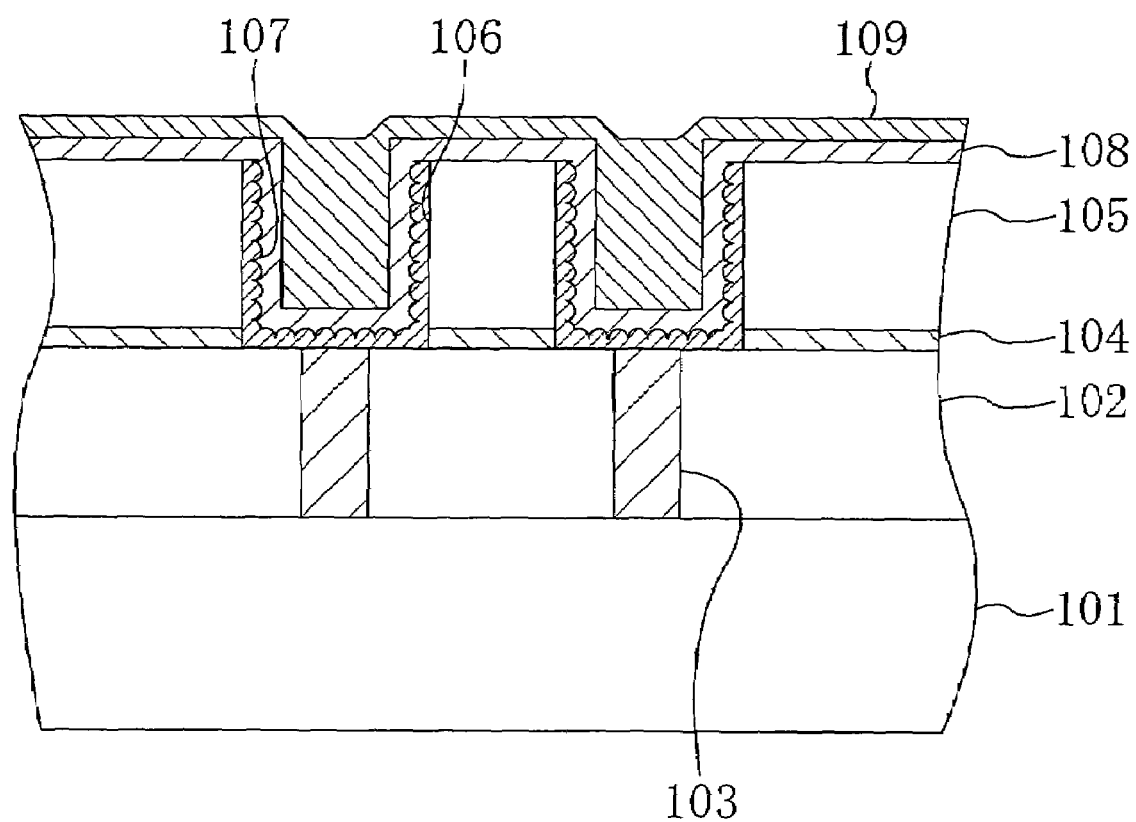
FIG. 6 is a structural cross-sectional view illustrating an essential part of a capacitive element of a three-dimensional structure according to a known example.
Figure 7:
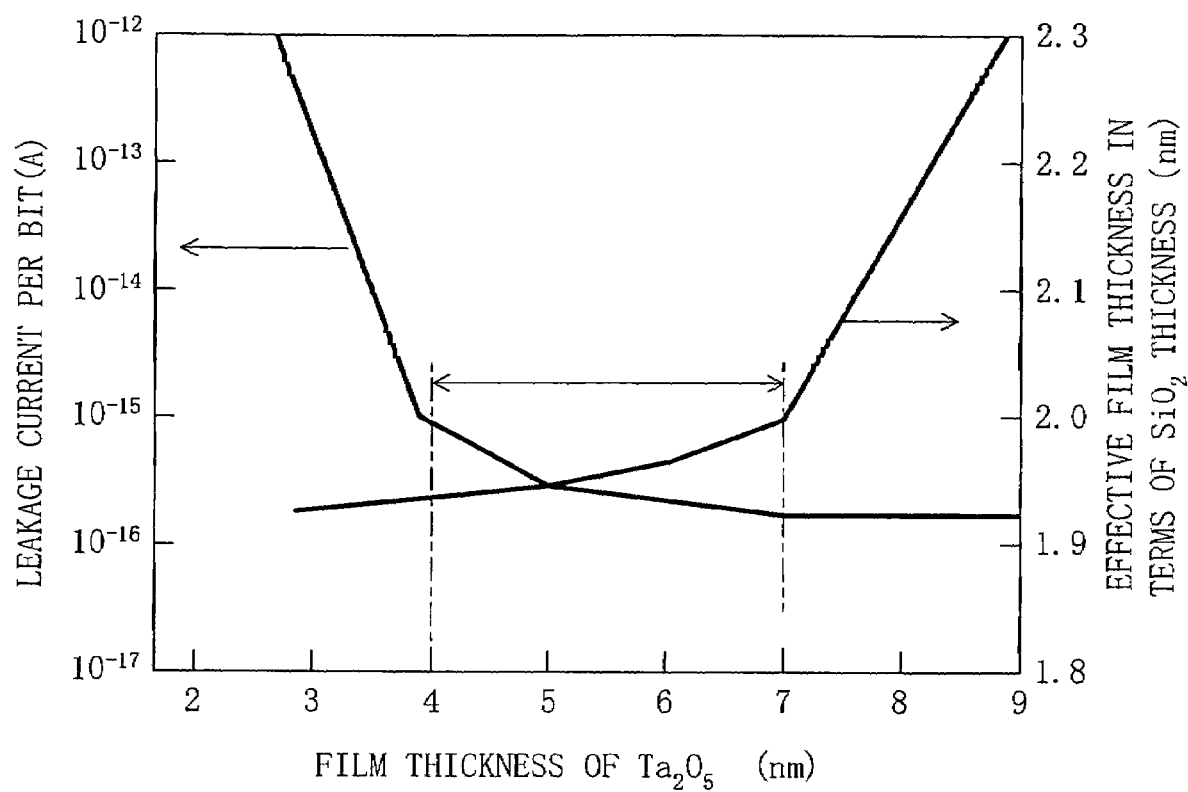
FIG. 7 is a graph illustrating, in the capacitive element of a three-dimensional structure according to the known example, the relationship of the leakage current and the effective thickness of a tantalum oxide film in terms of the thickness of $SiO_2$ with the thickness of a capacitor insulating film.

FIG. 5 shows a cross-sectional structure of an essential part of a capacitive element of a three-dimensional structure according to the second embodiment of the present invention. In FIG. 5, the same numerals are given to the same components as shown in FIG. 1. Thus, a description thereof is not given.

As shown in FIG. 5, capacitive elements 22 of the second embodiment are formed on a second interlayer insulating film 27 of silicon dioxide ($SiO_2$) or silicon nitride (SiN) to be concave in cross section. The second interlayer insulating film 27 is formed on the first interlayer insulating film 17. To be specific, a plurality of openings (holes) 27a are formed in the second interlayer insulating film 27 to expose corresponding plugs 18, and the capacitive elements 22 are formed along the bottom and side surfaces of the plurality of openings (holes) 27a. As a result, film-shaped lower electrodes 19 are electrically connected to the corresponding plugs 18.

The ratio between the depth and diameter of each hole 27a, that is, the value of the depth/diameter (aspect ratio) is 1 or more. The reason for this is that the surface areas of lower electrodes 19 that will be described below are to be increased as much as possible to increase the amount of storable charge. Furthermore, within the range of an aspect ratio of 1 or more, the diameter of each hole 27a is 0.2 through 0.8 $\mu$m both inclusive, and the depth of each hole 27a is 0.2 $\mu$m through 1.5 $\mu$m both inclusive.

Although not shown, each lower electrode 19 has a layered structure of lower and upper layers. The lower layer is an oxygen barrier made of a single-layer film or multilayer film containing at least one of iridium (Ir), iridium dioxide ($IrO_2$), ruthenium (Ru), ruthenium dioxide ($RuO_2$), titanium aluminum nitride (TiAlN), tantalum aluminum nitride (TaAlN), and titanium silicon nitride (TiSiN). The upper layer is an electrode film made of platinum (Pt), iridium (Ir), iridium dioxide ($IrO_2$), ruthenium (Ru), ruthenium dioxide ($RuO_2$), or strontium ruthenium trioxide ($SrRuO_3$). In this embodiment, the thickness of the lower electrode 19 is 50 nm through 200 nm.

A capacitor insulating film 20 made of $SrBi_2(Ta_xNb_{1-x})_2O_9$ that is a ferroelectric material is formed on the second interlayer insulating film 27 to cover the lower electrodes 19 located in the holes 27a. The capacitor insulating film 20 can be formed by metal organic chemical vapor deposition (MOCVD), atomic layer deposition or sputtering each having excellent step coverage. In this embodiment, the thickness of the capacitor insulating film 20 is set at 12.5 through 100 nm both inclusive. The size of each of crystal grains of the capacitor insulating film 20 in this case is set at 12.5 nm through 200 nm both inclusive. The reason for this is as described in the first embodiment.

An upper electrode 21 made of platinum (Pt), iridium (Ir), iridium dioxide ($IrO_2$), ruthenium (Ru), ruthenium dioxide ($RuO_2$), or strontium ruthenium trioxide ($SrRuO_3$) is deposited on the entire surface of the capacitor insulating film 20 to contact the capacitor insulating film 20. In this way, a capacitive element 22 for storing information is composed of the lower electrode 19, the capacitor insulating film 20 and the upper electrode 21.

As described above, according to the second embodiment, the capacitor insulating film 20 of a ferroelectric material, which constitutes a capacitive element 22 of a three-dimensional structure, is set to have a thickness of 12.5 through 100 nm both inclusive and a crystal grain size of 12.5 through 200 nm both inclusive as in the first embodiment.

Therefore, the capacitor insulating film 20 of a ferroelectric material can be restrained from being degraded in its polarization characteristics.

In the second embodiment, $SrBi_2(Ta_xNb_{1-x})_2O_9$ is used as a ferroelectric material as in the first embodiment. If bismuth lanthanum titanate $(Bi_xLa_{1-x})_4Ti_3O_{12}$, for example, is used instead, the conditions of heat treatment determinative of the crystal grain size are varied as follows. After the formation of the ferroelectric film that will be the capacitor insulating film 20, heat treatment is performed thereon, for example, within the range from 400° C. to 600° C., to determine the density of crystal nuclei, and then the crystals of the capacitor insulating film 20 are grown, for example, at 700° C. In this way, the size of each of crystal grains of the ferroelectric film is set within the range from 12.5 nm to 200 nm.

Plumbum zirconium titanate $(Pb(Zr_xTi_{1-x})O_3)$, instead of $SrBi_2(Ta_xNb_{1-x})_2O_9$ or $(Bi_xLa_{1-x})_4Ti_3O_{12}$, can be used as the ferroelectric material constituting the capacitor insulating film 20.

Since, as described above, the capacitive element according to the present invention and the semiconductor memory device using the same can prevent the capacitor insulating film of a ferroelectric material from being degraded in its polarization characteristics, they can provide excellent data storage characteristics. They are useful as a capacitive element of a three-dimensional structure comprising a capacitor insulating film made of a ferroelectric material and a semiconductor memory device or the like using the same, respectively.

What is claimed is:

1. A capacitive element comprising:
    a lower electrode having a three-dimensional shape;
    an upper electrode formed so as to be opposed to the lower electrode; and
    a capacitor insulating film formed between the lower and upper electrodes and made of a crystallized ferroelectric material,
    wherein the thickness of the capacitor insulating film is set within the range of 12.5 through 100 nm both inclusive, and
    the ferroelectric material has a polycrystalline structure, and its crystal grain size is 12.5 through 200 nm both inclusive.

2. The capacitive element of claim 1, wherein the voltage applied to the capacitor insulating film is 0.3 through 2.5 V both inclusive.

3. The capacitive element of claim 1, wherein the electric field applied to the capacitor insulating film is 250 kV/cm² or more.

4. The capacitive element of claim 1, wherein the capacitor insulating film is composed of one material selected from $SrBi_2(Ta_xNb_{1-x})_2O_9$, $Pb(Zr_xTi_{1-x})O_3$ and $(Bi_xLa_{1-x})_4Ti_3O_{12}$ (where $0 \leq x \leq 1$).

5. A capacitive element comprising:
    a lower electrode having a three-dimensional shape;
    an upper electrode formed so as to be opposed to the lower electrode; and
    a capacitor insulating film formed between the lower and upper electrodes and made of a crystallized ferroelectric material,
    wherein the thickness of the capacitor insulating film is set within the range of 12.5 through 100 nm both inclusive, and
    the lower electrode has a convex cross section and the ratio of the height to width (height/width) of the lower electrode is 1 or more.

6. The capacitive element of claim 5, wherein the width of the lower electrode is 0.2 through 1.0 μm both inclusive.

7. A capacitive element comprising:
    a lower electrode having a three-dimensional shape;
    an upper electrode formed so as to be opposed to the lower electrode; and
    a capacitor insulating film formed between the lower and upper electrodes and made of a crystallized ferroelectric material,
    wherein the thickness of the capacitor insulating film is set within the range of 12.5 through 100 nm both inclusive, and
    the lower electrode is formed along the bottom and side surfaces of a hole in an interlayer insulating film and the ratio of the depth to diameter of the hole (depth/width) is 1 or more.

8. The capacitive element of claim 7, wherein the diameter of the hole is 0.2 μm through 0.8 μm both inclusive.

9. The capacitive element of claim 5, wherein the ferroelectric material has a polycrystalline structure, and its crystal grain size is 12.5 through 200 nm both inclusive.

10. The capacitive element of claim 5, wherein the voltage applied to the capacitor insulating film is 0.3 through 2.5 V both inclusive.

11. The capacitive element of claim 5, wherein the electric field applied to the capacitor insulating film is 250 kV/cm² or more.

12. The capacitive element of claim 5, wherein the capacitor insulating film is composed of one material selected from $SrBi_2(Ta_xNb_{1-x})_2O_9$, $Pb(Zr_xTi_{1-x})O_3$ and $(Bi_xLa_{1-x})_4Ti_3O_{12}$ (where $0 \leq x \leq 1$).

13. The capacitive element of claim 7, wherein the ferroelectric material has a polycrystalline structure, and its crystal grain size is 12.5 through 200 nm both inclusive.

14. The capacitive element of claim 7, wherein the voltage applied to the capacitor insulating film is 0.3 through 2.5 V both inclusive.

15. The capacitive element of claim 7, wherein the electric field applied to the capacitor insulating film is 250 kV/cm² or more.

16. The capacitive element of claim 7, wherein the capacitor insulating film is composed of one material selected from $SrBi_2(Ta_xNb_{1-x})_2O_9$, $Pb(Zr_xTi_{1-x})O_3$ and $(Bi_xLa_{1-x})_4Ti_3O_{12}$ (where $0 \leq x \leq 1$).

* * * * *